United States Patent

Koshiishi

[11] Patent Number: 5,869,211
[45] Date of Patent: Feb. 9, 1999

[54] PHASE SHIFT MASK BLANK HAVING A COATED CENTRAL SHADING PATTERN AND UNCOATED PERIPHERAL PORTION

[75] Inventor: Kunihiko Koshiishi, Yamanashi-ken, Japan

[73] Assignee: Hoya Corporation, Tokyo, Japan

[21] Appl. No.: 528,143

[22] Filed: Sep. 14, 1995

Related U.S. Application Data

[62] Division of Ser. No. 128,541, Sep. 28, 1993, Pat. No. 5,474,807.

[30] Foreign Application Priority Data

Sep. 30, 1992 [JP] Japan .................................. 4-261562
Nov. 30, 1992 [JP] Japan .................................. 4-320203

[51] Int. Cl.⁶ .................................................. G03F 9/00
[52] U.S. Cl. ........................................................... 430/5
[58] Field of Search .............................. 430/5, 322, 323; 427/421, 434.5

[56] References Cited

U.S. PATENT DOCUMENTS

| | | | |
|---|---|---|---|
| 4,510,176 | 4/1985 | Cuthbert et al. | 427/82 |
| 5,234,499 | 8/1993 | Sasaki | 427/240 |
| 5,238,713 | 8/1993 | Sago | 427/240 |
| 5,258,073 | 11/1993 | Meier | 118/301 |
| 5,474,864 | 12/1995 | Isao | 430/5 |

FOREIGN PATENT DOCUMENTS 0090924 10/1983 European Pat. Off. .
58-19350 4/1983 Japan .
58-17374 10/1983 Japan .

*Primary Examiner*—S. Rosasco
*Attorney, Agent, or Firm*—Ladas & Parry

[57] ABSTRACT

In a method and an apparatus for processing, by the use of a processing solution, a substrate which has a principal surface divided into an unprocessing region and a processing region surrounding the unprocessing region, a guide member has an end portion which is faced with the processing region with a gap left between the processing region and the end portion and with an inside space left between the unprocessing region and the guide member. The processing solution is supplied to and kept in the gap due to capillarity and surface tension of the processing solution without being spread onto the unprocessing region. Thus, the processing region alone is processed by the processing solution. When the principal surface is supported by the guide member, the processing solution may be given from a back surface of the substrate to the gap through a side gap formed between the guide member and the substrate. Alternatively, when the guide member is covered over the principal surface of the substrate with the back surface of the substrate supported on a support member, the processing solution is fed onto the guide member and sent into the gap through via holes formed on the end surface of the guide member. The processing solution may be either a solvent or a resist solution. The substrate may serve to form a phase shift mask blank, a reticle testing substrate, or the like.

5 Claims, 8 Drawing Sheets

5,869,211

1

PHASE SHIFT MASK BLANK HAVING A COATED CENTRAL SHADING PATTERN AND UNCOATED PERIPHERAL PORTION

This is a divisional of copending application(s) Ser. No. 08/128,541 filed on Sep. 28, 1993, now U.S. Pat. No. 5,474,807.

BACKGROUND OF THE INVENTION

This invention relates to a method and an apparatus for use in processing a substrate to remove or form a film on a processing region of the substrate. It should be noted throughout the instant specification that the method and the apparatus are used in manufacturing a photomask, a photomask blank, a reticle, a reticle blank, a reticle testing substrate, a semiconductor substrate, a magnetic disk, a color filter, and the like, although description will be mainly made about the photomask blank and the reticle testing substrate.

Recent requirements have been directed to a photomask blank which can delineate a fine pattern at a high precision and a high resolution by the use of a photolithography technique. To this end, a phase shift method has been proposed in Japanese Unexamined Patent Publication Shô 58-173744. With this method, it is possible to manufacture a phase shift photomask blank which comprises a transparent substrate, a plurality of opaque patterns on the substrate, and a transparent film on the substrate and the patterns. The transparent film is selectively etched into transparent patterns by a photolithography technique to manufacture the phase shift photomask.

Herein, the transparent film is formed by a spin coating technique in consideration of flatness of the transparent film. A flat transparent film is produced by the use of the spin coating technique at a center portion of the transparent film and may be, for example, a resist film. However, the flatness of the transparent film is not kept at a peripheral portion of the film because the transparent film tends to become thick at the peripheral portion due to the spin coating technique, as known in the art. In other words, the peripheral portion of the transparent film has an irregular thickness when the spin coating technique is used to form the transparent film.

Moreover, the periphery of the phase shift photomask is intended to be attached or supported by other equipment, such as a support member when optically coupled to an optical system for the photolithography. This means that the periphery of the phase shift photomask is preferably flat as, otherwise, optical adjustment of the phase shift photomask becomes difficult because of the irregular thickness of the peripheral portion of the transparent film.

In order to avoid the irregular thickness of the peripheral portion, disclosure is made in Japanese Patent Publication No. Shô 58-19350, for removing the transparent film at the peripheral portion thereof from the substrate. More specifically, a solvent for the transparent film is discharged from a nozzle onto the peripheral portion of the transparent film. However, the solvent is not confined only to the peripheral portion of the transparent film. In this case, the peripheral portion of the transparent film is referred to as a processing region while the remaining portion is an unprocessing region. With this method, the solvent undesirably spreads from the processing region to the unprocessing region. As a result, the unprocessing region of the transparent film is often dissolved by the solvent in addition to the processing region.

Alternatively, a reticle testing substrate is used for optically testing a reticle which has a pattern on a reticle surface.

2

In other words, the reticle testing substrate serves to determine whether or not a failure is included in the pattern on the reticle. To this end, such a reticle testing substrate comprises a quartz substrate having a substrate surface, an opaque film of chromium deposited on a peripheral region of the substrate surface, and a resist film uniformly coated on the substrate surface and the opaque film. In this situation, the pattern on the reticle surface is optically transcribed onto the resist film coated on the substrate surface of the reticle testing substrate by the use of a step and repeat technique. Such optical transcription of a pattern is carried out by adjusting a focus of an optical system to the opaque film. Thus, a resist pattern is formed on the substrate surface and is identical with the pattern on the reticle to be tested.

Under the circumstances, light is emitted onto the resist pattern through the reticle testing substrate so as to form a pattern image of the resist pattern by the light and to check whether or not a failure is included in the pattern image. When a failure is found on the pattern image, the reticle which corresponds to the reticle testing substrate is rejected as a faulty reticle and, otherwise, the reticle is accepted as a non-faulty reticle.

Herein, it is to be noted that the opaque film of chromium is left only along the periphery of the quartz substrate and may not be always precise in size. In order to leave the opaque film only along the periphery of the quartz substrate, a chromium film is deposited on the quartz substrate and the photoresist layer is left only on a peripheral portion of the chromium film. Thereafter, the chromium film is etched by an etchant to leave the opaque film along the periphery of the quartz substrate. In this way, it is very simple to leave the photoresist film only along the peripheral portion, namely, the processing region of the chromium film.

SUMMARY OF THE INVENTION

It is an object of this invention to provide a method of processing a substrate, which is capable of readily and accurately processing only a processing region on the substrate by the use of a processing solution.

It is another object of this invention to provide a method of the type described, which is capable of removing superfluous film in the processing region by a solvent used as the processing solution.

It is still another object of this invention to provide a method of the type described, which is capable of forming a desirable film only in the processing region.

It is yet another object of this invention to provide an apparatus which is capable of effectively processing only a processing region by the use of a processing solution.

It is another object of this invention to provide an apparatus of the type described, which is capable of desirably removing superfluous film only in the processing region by the solvent.

It is another object of this invention to provide an apparatus of the type described, which is capable of forming a desirable film only in the processing region.

It is a further object of this invention to provide a product, such as a photomask blank, a reticle blank, which can be manufactured by the above-mentioned method and apparatus.

A method according to an aspect of this invention is for use in processing, by the use of a processing solution, a substrate which has a principal surface divisible into an unprocessing region and a processing region surrounding the unprocessing region. The method comprises the steps of preparing a guide member having a bottom portion and an extended portion which is contiguous to the bottom portion and which defines an end portion corresponding to the processing region, locating the guide member and the substrate with a gap between the end portion of the guide member and the processing region of the substrate and with an internal space between the unprocessing region and the bottom portion and which is wider than the gap, and supplying the processing solution to the gap to process the processing region by the processing solution with the processing solution confined in the gap alone.

An apparatus according to another aspect of this invention to carry out the method comprises a guide member having a bottom portion and an extended portion which is contiguous to the bottom portion and which defines an end portion corresponding to the processing region, a spacer member located between the guide member and the substrate with a gap between the end portion of the guide member and the processing region of the substrate and with an internal space between the unprocessing region and the bottom portion and which is wider than the gap, and a solution supplying member for supplying the processing solution to the gap to process the processing region by the processing solution with the processing solution confined in the gap alone.

DESCRIPTION OF THE PREFERRED EMBODIMENTS

Figure 1:
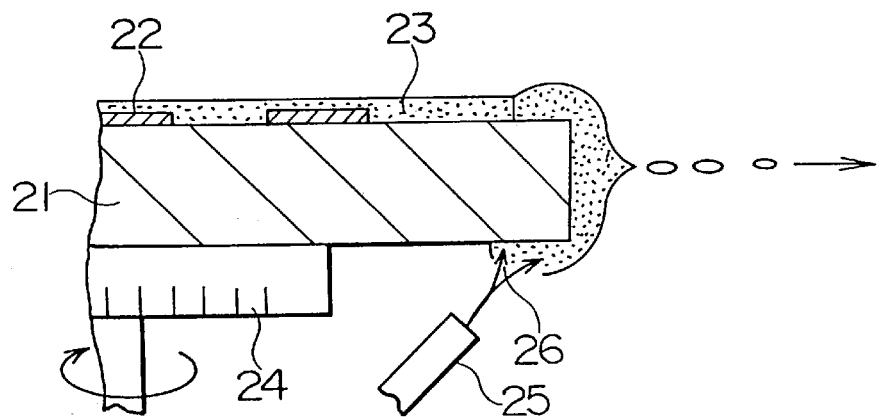
FIG. 1 is a schematic sectional view of a conventional apparatus for use in removing an unnecessary film from a substrate.

Referring to FIG. 1, description will be directed to a conventional method which is substantially equivalent to that mentioned in Japanese Patent Publication Shô 58-19350, described previously in the instant specification. The conventional method is for use in manufacturing a phase shift photomask blank formed from a substrate block as shown in FIG. 1. In the illustrated example, the substrate block comprises a transparent substrate 21 having a principal or front surface directed upwards in FIG. 1, a plurality of opaque or shading films 22 on the principal surface, and a coated film 23 covering the principal surface and the opaque films 22. The principal surface is divided into an unprocessing or a center region located at a center portion of the principal surface and a processing or a peripheral region surrounding the center portion. Thus, the processing region is placed at a peripheral portion of the principal surface.

The illustrated substrate block is supported by a turntable 24 and is rotated on the turntable 24 as indicated by an arrow. A nozzle 25 is directed towards a peripheral region of a back surface opposite the principal surface of the substrate 21. Thus, the nozzle 25 is placed under the substrate 21 in the example being illustrated.

It is assumed that the coated film 23 is coated by a spin coating method and is therefore flat on the center portion of the principal surface and is irregularly thick or heaped at the peripheral region of the principal surface. A solvent 26 is discharged through the nozzle 25 so as to dissolve the coated film 23 in the processing region thereof and to remove the coated film 23 from the processing region, namely, the peripheral portion while the substrate block is rotated on the turntable 24.

In this event, the solvent 26 travels along a side surface of the substrate 21 by surface tension and moves on the coated film 23 of the peripheral region of the principal surface. As a result, the coated film 23 is dissolved at the peripheral region of the principal surface and the side surface, as illustrated in FIG. 1. Thereafter, the solvent is blown off the substrate block by centrifugal force resulting from the rotation of the block, as shown in FIG. 1. Thus, the processing region of the coated film 23 is removed from the substrate 21.

With this method, it is difficult to determine conditions for removing only the coated film 23 at the processing region. Consequently, the coated film 23 in the unprocessing region is often removed, as pointed out previously in the instant specification.

Figure 2:
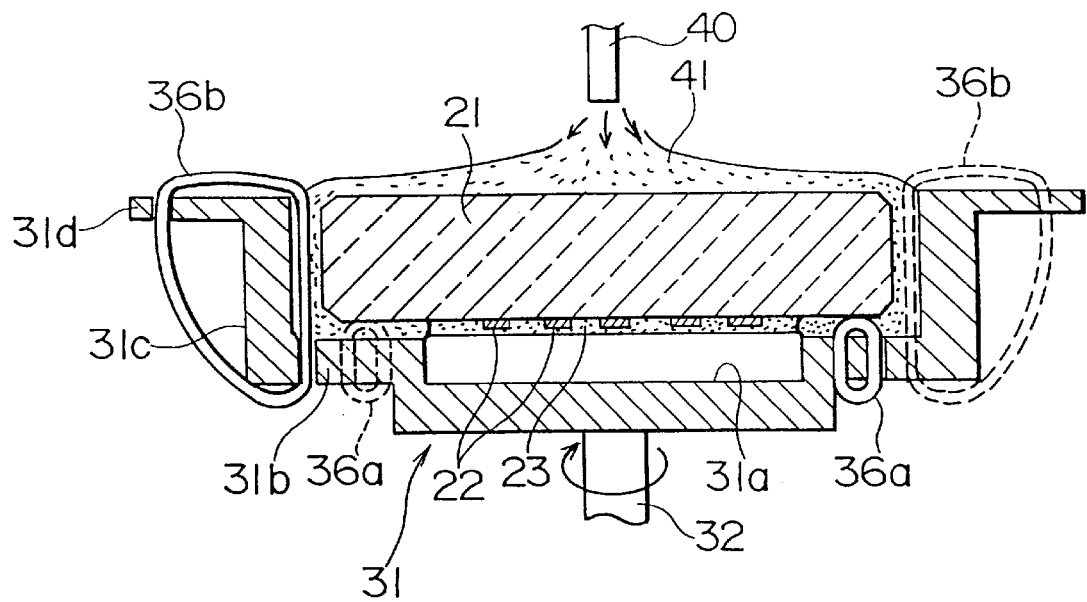
FIG. 2 is a sectional view of an apparatus according to a first embodiment of this invention.

Referring to FIG. 2, an apparatus according to a first embodiment of this invention is for use in manufacturing a phase shift photomask blank by removing a superfluous or an undesired coated film from a substrate block. As in FIG. 1, the substrate block comprises a transparent substrate 21 of quartz glass which has a size of 6 (inches)×6 (inches)×0.25 (inch) and a principal or front surface 21a directed downwards of FIG. 2 and a back surface 21b opposite the principal surface 21a. A plurality of opaque films or shading films 22 are deposited on a center region of the principal surface 21a of the substrate 21 to form a shading pattern and are covered with a coated film 23 which may be, a polysiloxane SOG (Spin-On-Glass) film as known in the art and which is assumed to be coated by spin coating in the illustrated example. The spin coating may be carried out by the use of a coating solution which includes silicon oxide and which may be, for example, ACCUGLASS211S manufactured and sold by Allied Signal Company Ltd.

Figure 3:
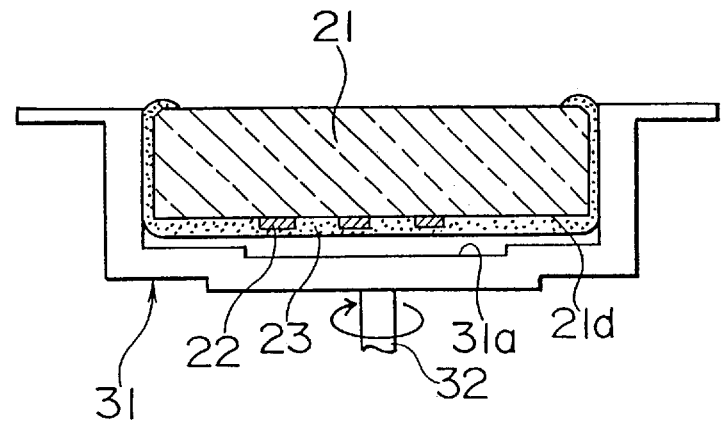
FIG. 3 is a schematic sectional view for use in describing operation of the apparatus illustrated in FIG. 2.
Figure 4:
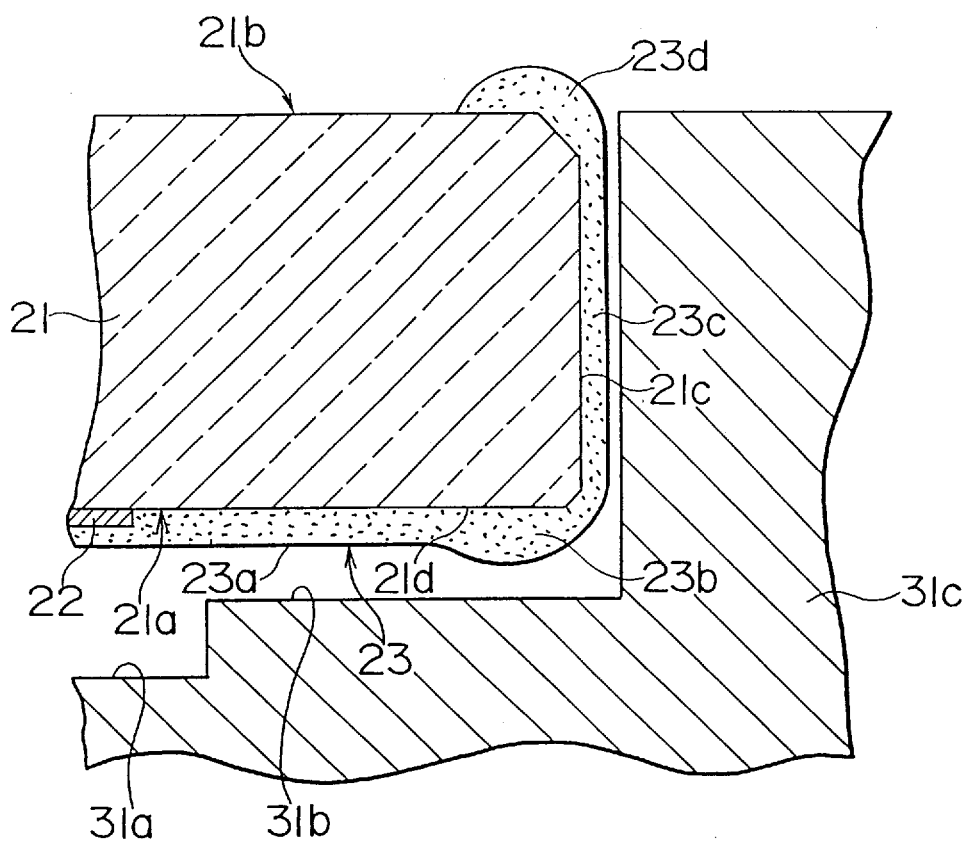
FIG. 4 is a partial sectional view for use in describing a state of a substrate processed by the apparatus illustrated in FIG. 2.

Referring to FIGS. 3 and 4 together with FIG. 2, the coated film 23 extends over the entire principal surface 21a and may extend on a side surface 21c of the substrate 21 and the back surface 21b of the substrate 21. In FIGS. 3 and 4, the coated film 23 is on the principal surface 21a and both the side and the back surfaces 21c and 21b. The coated film 23 has a thickness of about 4,000 angstroms at the center region and is formed by spin coating the above-mentioned coating solution at a rotation speed of 1,000 rpm for ten seconds.

As illustrated in FIGS. 3 and 4, the coated film 23 has a flat or uniform portion 23a at the center region of the substrate 21, a heaped up portion 23b at the peripheral region 21d of the substrate 21, a side portion 23c on the side surface 21c of the substrate 21, and a back portion 23d on the back surface 21b of the substrate 21. Thus, the coated film 23 is flat in the center region of the principal surface 21a and is uneven on the peripheral region 21d surrounding the central surface of the substrate 21. In other words, the spin coating tends to undesirably form the heaped up portion 23b at the peripheral region 21d of the substrate 21, as pointed out in conjunction with FIG. 1. The back portion 23d is also heaped up on the back surface 21b as on the peripheral portion 21d of the substrate 21.

In the illustrated example, the coated film 23 on the peripheral region 21d is removed or processed together with the coated film 23 of both the side surface 21c and the back surface 21b in a manner similar to the spin coating. In this connection, the peripheral portion 21d and the center region of the principal surface will be referred to as a processing region and an unprocessing region, respectively.

The apparatus shown in FIG. 2 serves to remove the heaped up portion 23b, the side portion 23c and the back portion 23d by the use of a solvent which can dissolve the coated film 23 and which may be, for example, acetone.

The illustrated apparatus comprises a guide member 31 of cup shape which is rotatable with a rotation axle 32. The rotation axle 32 is mechanically coupled to a motor or the like (not shown) and can be rotated at a rotation speed determined by the motor. The guide member 31 has a bottom section 31a fixed to the rotation axle 32, an extended portion 31b contiguous to the bottom section 31a and offset from the bottom portion 31a, and a wall portion 31c extending upright from the extended portion 31b. The wall portion 31c is contiguous to an external portion 31d disposed horizontally outside of the wall portion 31c. In the example being illustrated, the extended portion 31b defines an end portion which is offset upwards in FIG. 2 and which faces the peripheral region 21d of the principal surface 21a in a manner to be described later in detail.

Figure 5:
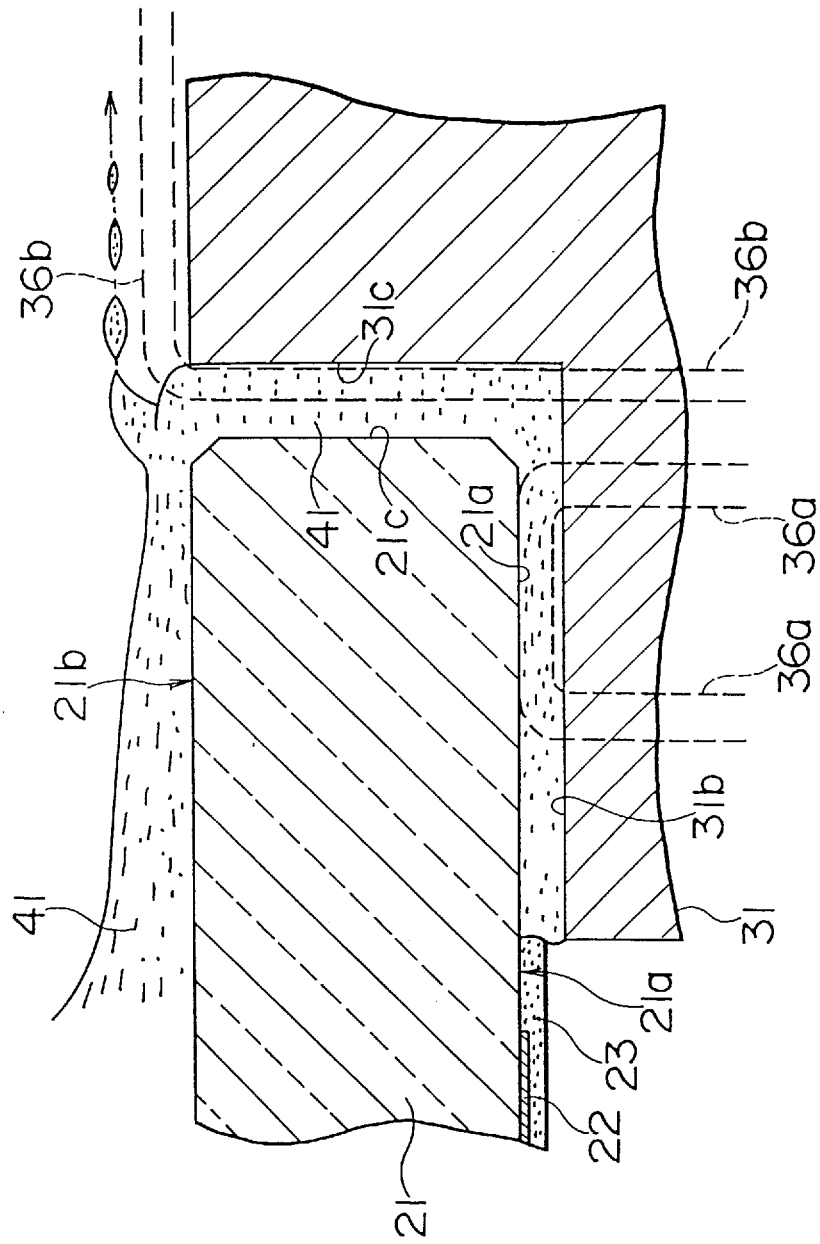
FIG. 5 is a partial sectional view for use in describing a process carried out by the apparatus illustrated in FIG. 2.

As shown in FIGS. 3 through 5, a block setting zone is formed within the guide member 31 to locate the substrate block and is defined by the bottom portion 31a, the extended portion 31b, and the wall portion 31c. The block setting zone serves to keep the substrate block substantially horizontal and therefore has a size which can accommodate the substrate block in the block setting zone.

In addition, a plurality of nylon threads 36a each of which is 0.1 millimeter thick are arranged on the extended portion 31b, with a top of each nylon thread 36a projecting upwards, as shown in FIG. 2. Each of the nylon threads 36a forms a loop or a ring, as illustrated in FIG. 2, and is called a nylon ring. The nylon rings 36a may be positioned with a spacing between two adjacent nylon rings 36a and the nylon rings serve as spacers between the extended portion 31b and the substrate block, as will later be described. In the illustrated example, the nylon rings 36a are equal in number to eight.

Moreover, a plurality of additional nylon threads 36b are also arranged at the external portion 31d and the wall portion 31c. Each of the nylon threads 36b is formed as a loop and is called a nylon loop. The additional nylon loops 36b are arranged so that each additional nylon loop 36b surrounds the wall portion 31c as shown in FIG. 2. Each additional nylon loop 36b serves as an additional spacer between the side surface 21c of the substrate 21 and the wall portion 31c and sixteen nylon loops 36b are employed in the illustrated example. Every other one of the additional nylon threads 36b has a thickness or a diameter of about 0.44 millimeter while each of the remaining additional nylon threads 36b has a thickness or a diameter of about 0.21 millimeter. The thinner nylon threads also serve to cause the solvent to flow smoothly along the thin nylon threads and, as a result, to guide the solvent as will become clear later.

A nozzle 40 is opposite the guide member 31 and is perpendicular to the bottom portion 31a of the guide member 31. The solvent is sprayed through the nozzle 40 downwards in FIGS. 2 through 5, as depicted at 41 in FIG. 2.

In operation, the substrate block is set in the block setting zone of the guide member 31 illustrated in FIGS. 2 through 5, with the principal surface 21a of the substrate 21 directed downwards in FIGS. 2 through 5. In this situation, the nylon rings 36a are brought into contact with the heaped up portion 23b of the coated film 23 formed on the peripheral region 21d of the substrate 21. Thereby the substrate block is kept substantially horizontal with a gap left between the extended portion 31b of the guide member 31 and the coated film 23 on the substrate 21. The gap is determined by the thickness or a diameter of each of the nylon threads 36a. The gap may have a size of about 0.17 millimeter. Likewise, the substrate block is spaced from the wall portion 31c within the block setting zone by a side gap determined by the additional nylon loops 36b, as shown in FIG. 2. The side gap may have a width of 0.44 millimeter.

Thus, the peripheral region 21d of the substrate 21 faces the extended portion 31b of the guide member 31 with the gap left therebetween. On the other hand, the center region 21a of the substrate 21 faces the bottom portion 31a of the guide member 31 at an internal spacing which is wider than the gap, as readily understood from FIGS. 2 through 5. In other words, the processing region and the unprocessing region of the substrate 21 are opposed the extended portion 31b and the bottom portion 31a respectively of the guide member 31 through the gap and the internal spacing, respectively.

At first, the guide member 31 is rotated at a first rotation speed of 50 rpm. During the rotation of the guide member 31, the solvent, for example, acetone, is sprayed in an amount of 25 milliliters from the nozzle 40 towards the back surface 21b of the substrate 21, as shown in FIG. 2. During this process, the solvent is caused to flow from the back surface 21b of the substrate 21 along the side portion 23c of the coated film 23 to the peripheral portion 23b of the coated film 23. On the peripheral portion 23b of the coated film 23, the solvent travels by capillarity towards the center region 21a of the substrate 21 through the gap defined by the nylon rings 36a.

When the solvent has reached an offset portion, namely, a boundary between the extended portion 31b and the bottom portion 31a of the guide member 31, the solvent stops due to the surface tension of the solvent. Therefore, the solvent does not travel to the center region 21a, namely, the unprocessing region of the substrate 21. Consequently, the coated film 23 is not removed by the solvent at the center region 21a of the substrate 21. On the other hand, the back portion 23d and the side portion 23c of the coated film 23 are contacted by the solvent together with the peripheral portion 23b, which causes dissolution reaction to occur between the solvent and the coated film 23. The dissolution reaction brings about dissolving of the coated film 21 by the solvent and removal of the coated film 21 at the peripheral, side, and back portions 23b, 23c, and 23d. Thus, the coated film 23 is dissolved only at the processing region of the substrate 21 and not at the unprocessing region of the substrate 21.

After the dissolving action is finished between the solvent and the coated film 23, the guide member 31 is rotated at a high or a second rotation speed of 1500 rpm for one second. During this high speed rotation, the dissolved coated film is scattered outside the substrate block. Thus, unnecessary films coating at the peripheral region, the side surface 21c, and the back surface 21b are removed from the substrate 21. Herein, it is to be noted that the above-mentioned solvent scattering process should be completed before the volatile solvent has thickened.

In order to thoroughly remove the unnecessary coated film, dissolving is carried out at a third rotation speed of 70 rpm for ten seconds after the solvent scattering process. Subsequently, dissolving is carried out at a fourth rotation speed of 100 rpm for ten seconds and this is followed by a drying and scattering process carried out at a fifth rotation speed of 1500 rpm for ten seconds. The substrate block is thus converted into the phase shift mask blank by removal of the unnecessary coated film.

Finally, rotation of the guide member 31 is stopped and the phase shift mask blank is taken out of the guide member 31. The phase shift mask blank manufactured in the above-mentioned manner comprises a phase shift film which is composed of the coated film and which is left in a square shape on the center region of the substrate 21.

The solvent may be replaced by methanol, isopropyl alcohol, or the like.

In FIG. 5, the side gap between the wall portion 31c of the guide member the side surface 21c of the substrate 21 is assumed to be equal in width to 0.44 millimeter in the above-mentioned example. However, the side gap may have a gap width such that the solvent 41 can flow through the side gap along the side surface 21c of the substrate 21 towards the peripheral region 21a.

In addition, although the gap between the extended portion 31b of the guide member 31 and the peripheral region 21d of the substrate 21 is assumed to be equal to 0.17 millimeter, the size or width of the gap may be determined in consideration of the viscosity of the solvent so that the solvent can flow into the gap and can be held within the gap by the surface tension of the solvent. Furthermore, the gap need not have a uniform width but may be gradually tapered from the outer periphery of the substrate 21 towards the center region of the substrate 21. In the latter case, the gap gradually narrows as the gap approaches the center region of the substrate 21. With this construction the solvent can be readily introduced into the gap.

In the above-mentioned method, the guide member 31 is rotated so as to dissolve the coated film 23 and to scatter the solvent which dissolved the coated film 23. Although such rotation processes are alternately repeated three times for each of the dissolving and the scattering steps in the above-mentioned example, the rotation processes may be carried out at least one time for each of the dissolving and the scattering operations. The rotation speed and the rotation time may be optionally selected in consideration of the solvent used, the thickness of the coated film 23, and the like.

In practice, the method illustrated with reference to FIGS. 2 through 5 has been applied to removal of the heaped up portion 23b of the coated film which provides a maximum thickness of about 1.6 micronmeters at a position about 10 millimeters from the outer periphery of the substrate 21 and a thickness of about 0.3 micronmeter at a position 21 millimeters from the outer periphery of the substrate 21. In this case, the coated film 23 has been removed over a width of about 20.0 millimeters from the outer periphery of the substrate 21. Stated otherwise, the heaped up portion 23b of about 20.0 millimeters has been removed in a rectangular shape from the peripheral region 21d of the substrate 21. As a result, the remaining coated film 23 has a thickness of about 0.3 micronmeter at a position about 21 millimeters from the outer periphery of the substrate 21. It has been found that the coated film 23 which is about 0.3 micronmeter thick has no cracks therein and is very convenient for the phase shift mask blank.

Thus, the phase shift mask blank retains the coated film 23 except for the peripheral region 21d, the side surface 21c, and the back surface 21b. With this mask blank, it is possible to prevent adherence of any dust to the back and the side surfaces 21c and 21b of the substrate 21 and to therefore keep the phase shift mask blank clean. Moreover, the phase shift mask blank can be accurately attached to an exposure device or other optical device by mounting the peripheral region 21d onto such an exposure device.

Figure 6:
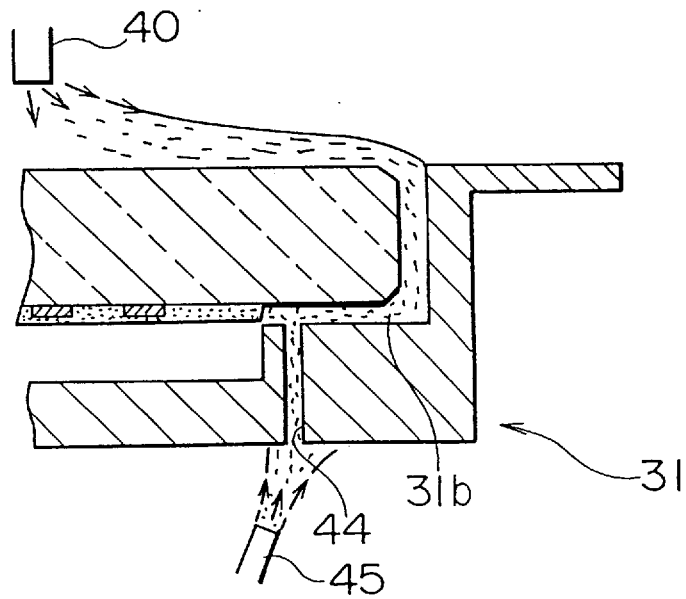
FIG. 6 is a partial sectional view of an apparatus according to a modification of the first embodiment of this invention.

Referring to FIG. 6, an apparatus according to a modification of the first embodiment illustrated in FIGS. 2 through 5 further comprises a through hole 44 formed in the extended portion 31b of the guide member 31 and an additional nozzle 45 which is placed under the guide member 45 and which faces the through hole 44. The guide member 31 has an internal side surface defining the through hole 44.

In the illustrated example, the solvent 41 is discharged from the nozzle 40 placed over the substrate 21 and is simultaneously discharged from the additional nozzle 45. With this structure, the superfluous coated film is very quickly removed from the substrate 21, which is helpful to manufacture the phase shift mask blank at a high speed in comparison with the method illustrated in conjunction with FIGS. 2 through 5.

Figure 7:
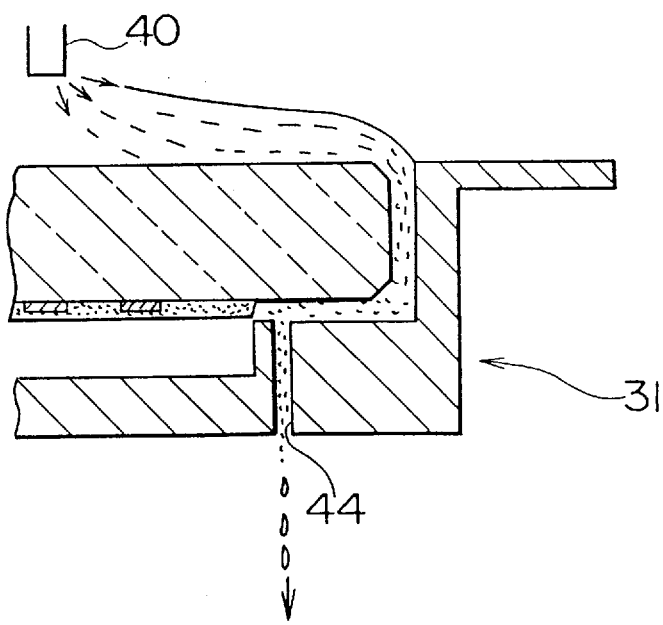
FIG. 7 is a similar view of an apparatus according to another modification of the first embodiment of this invention.

Referring to FIG. 7, an apparatus according to another modification of the first embodiment illustrated in FIGS. 2 through 5 comprises no additional nozzle 45, although the through hole 44 is formed through the guide member 31. In this case, the through hole 44 serves to discharge unnecessary solvent therethrough. The discharge of the unnecessary solvent can be smoothly carried out when a thread or a needle is inserted in the through hole 44.

The nylon threads 36a and 36b which act as spacers may be replaced by projections formed by screws or tapes which are composed of a material insoluble in the solvent.

Figure 8:
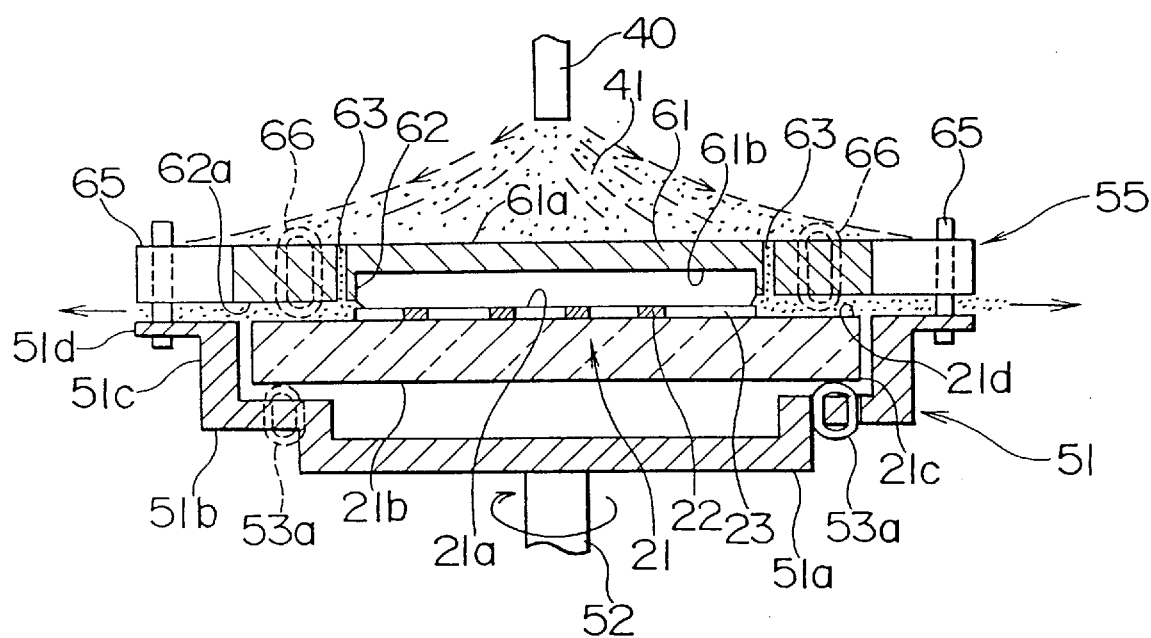
FIG. 8 is a sectional view of an apparatus according to a second embodiment of this invention.

Referring to FIG. 8, an apparatus according to a second embodiment of this invention is shown for manufacturing a phase shift mask blank by removing superfluous coated film from a substrate block, as in the first embodiment. It is to be noted that the substrate block is directed upwards in FIG. 8, which differs from the apparatus illustrated in FIGS. 2 through 7. In this connection, the substrate block comprises similar parts designated by like reference numerals. Specifically, the substrate block comprises the substrate 21 of glass having the principal or front surface 21a directed upwards in FIG. 8, the back surface 21b directed downwards in FIG. 8, and the side surface 21c contiguous to the principal and the back surfaces 21a and 21b. The principal surface 21a is divided into the center region and the peripheral region 21d.

A plurality of opaque or shading films 22 are selectively formed on the principal surface 21a and are covered with coated film 23 which extends over the entire principal surface 21a and which may be, for example, a poly-siloxane spin-on-glass (SOG) film as in the first embodiment.

In practice, the illustrated substrate comprises the substrate of quartz glass having a size of 6 (inches)×6 (inches) ×0.25 (inch), the shading films 22 of chromium, and the coated film 23 of the poly-siloxane SOG. The shading films 22 are deposited at the center region of the principal surface 21a and are not deposited at the peripheral region 21d. On the other hand, the coated film 23 is coated by spin coating and extends from the center region of the principal surface 21a to the peripheral region 21d. At the peripheral region 21d, the coated film 23 is heaped up as mentioned in conjunction with FIG. 4. Specifically, the spin coating has been carried out at a rotation speed of 1000 rpm for ten seconds. The resultant coated film 23 has a thickness of 4,000 angstroms in the center region, a thickness of 1.6 micronmeters at the heaped up portion, and a thickness of 0.3 micronmeter at a distance of 2.1 millimeters from the outer periphery of the substrate block.

The apparatus shown in FIG. 8 comprises a support member 51 which is similar in structure to the guide member 31 shown in FIGS. 2 through 7 and which serves to support the back surface 21b of the substrate 21. The support member 51 is fixed to a rotation axle 52 mechanically coupled to a motor or the like and is rotated at a rotation speed determined by the motor. More particularly, the support member 51 has a bottom part 51a of a dish shape in section, an extended part 51b offset from the bottom part 51a with an offset part between the bottom part 51a and the extended part 51b, a wall part 51c extending upright from the extended part 51b, and an external part 51d extending horizontally outwards from the wall part 51c.

A plurality of nylon rings 53a are arranged on the extended part 51b so that the top of each nylon ring 53a projects from the extended part 51b. In the illustrated example, the nylon rings 53a are equal in number to eight and are spaced from one another at the periphery of the extended part 51b and have individually a thickness or diameter of 0.15 millimeter. Thus, the nylon rings 53a rest on the extended part 51b in a manner similar to the nylon rings 36a illustrated in FIG. 2. As readily understood from FIG. 8, the bottom part 51a defines an inner space smaller in size than the size of the substrate block while the wall part 51c defines an internal space somewhat greater in size than the substrate block. Accordingly, the substrate block can be accommodated within the support member 51 in the illustrated manner.

The apparatus further comprises a guide member 55 which is operable in a manner similar to the guide member 31 mentioned in conjunction with FIGS. 2 through 7 and which is supported on the support member 51 so that the substrate block is covered by the guide member 55. More specifically, the guide member 55 has a cup shape in section as in FIGS. 2 through 7 but is upset relative to that illustrated in FIGS. 2 through 7. Thus, the illustrated guide member 55 covers the substrate block and is referred to as a cover member.

The guide member 55 has an outer configuration substantially corresponding to that of the support member 51 and is of a square shape in the illustrated example. The guide member 55 further has a base portion 61 directed upwards in FIG. 8 and a wall portion 62 which extends downwards in FIG. 8 from the base portion 61 and which defines an inside space therein. In any event, the guide member 55 has a cup shape in section while the inside space has a square shape.

The base portion 61 operates similarly to the bottom portion 31a of the guide member 31 shown in FIGS. 2 through 7 and is called a bottom portion. The base portion 61 of FIG. 8 has a base surface 61a directed upwards in FIG. 8 and an inside surface 61b directed downwards. The wall portion 62 has a wall end surface 62a which is directed downwards in FIG. 8 and which faces the principal surface of the substrate 21. The inside space is defined by the inside surface 61b and the wall portion 62.

As readily understood from FIG. 8, the wall end surface 62a of the guide member 55 covers the peripheral region of the principal surface of the substrate 21 while the inside surface 61b is opposite a center region of the principal surface of the substrate 21. Thus, the wall end surface 62a faces a processing region of the substrate 21 while the inside surface 61b faces the region of the substrate 21 not to be processed, as in the guide member 31 shown in FIGS. 2 to 7. In the illustrated example, the difference in height between the inside surface 61b and the wall end surface 62a is equal to 1.5 millimeters while the peripheral region of the substrate 21 is spaced by a distance of about 20 millimeters from the wall portion 62.

Figure 9:
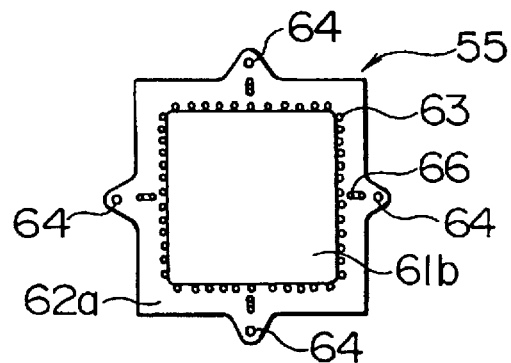
FIG. 9 is a plan view of a guide member for use in the apparatus illustrated in FIG. 8.

Referring to FIG. 9 in addition to FIG. 8, the guide member 55 has an inside surface of square shape surrounded by the wall end surface 62a. At the wall end surface 62a, a number of holes 63 are formed along an inside edge of the wall end surface 62a and the holes 63 are spaced from one another at a predetermined distance. In addition, the guide member 55 has four projected portions and four openings 64 formed in the projected portions. In FIG. 9, the projected portions are placed in a center region of each outer side edge of the wall end surface 62a. The openings 64 serve to insert positioning pins 65 (FIG. 8) and to fasten the guide member 55 to the support member 51, as shown in FIG. 8. Consequently, the guide member 55 can be rotated around the rotation axle 52 together with the support member 51 and the substrate block.

Moreover, four nylon loops or rings 66 are disposed at positions radially inwards of the openings 64. Each of the nylon rings 66 partially protrudes at the wall end surface 62a and the base surface 61a, as depicted at FIG. 8. The nylon rings 66 protruding at the wall end surface 62a serve as spacers which keep a gap between the guide member 55 and the substrate 21, as for the nylon rings 36a shown in FIG. 2. In the illustrated example, the nylon thread used for each of the nylon rings 66 has a thickness or a diameter of about 0.15 millimeter. As a result, the gap between the wall end surface 62a and the substrate block is kept at 0.15 millimeter while the space between the substrate block and the inside surface 61b of the guide member 55 becomes equal to 1.65 millimeters.

Turning back to FIG. 8, the nozzle 40 is placed over the guide member 55 to discharge the solvent 41 at a preselected speed onto the base surface 61a of the guide member 55. Thus, the nozzle 40 illustrated in FIG. 8 faces the base surface 61a of the guide member 55 and is connected to a solvent feeder (not shown) for feeding the solvent 41 to the nozzle 40. The solvent 41 may be, for example, acetone or the like when the coated film 23 is formed by poly-siloxane SOG.

Figure 10:
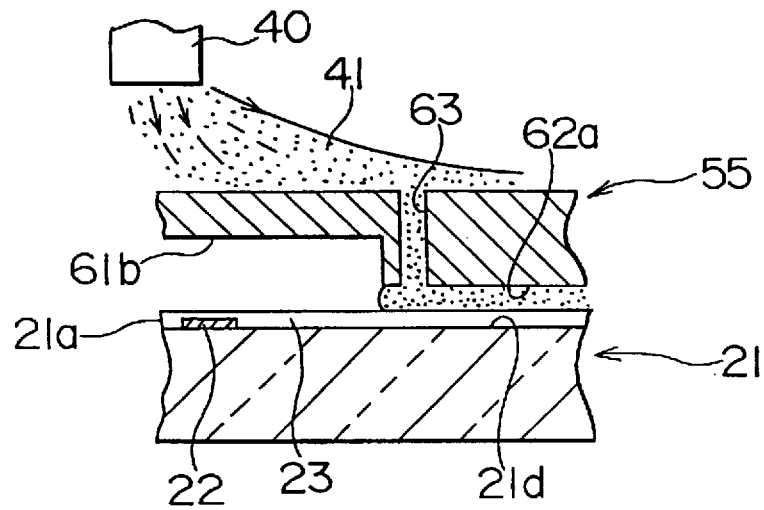
FIG. 10 is a partial sectional view for use in describing a process carried out by the apparatus illustrated in FIG. 8.
Figure 11:
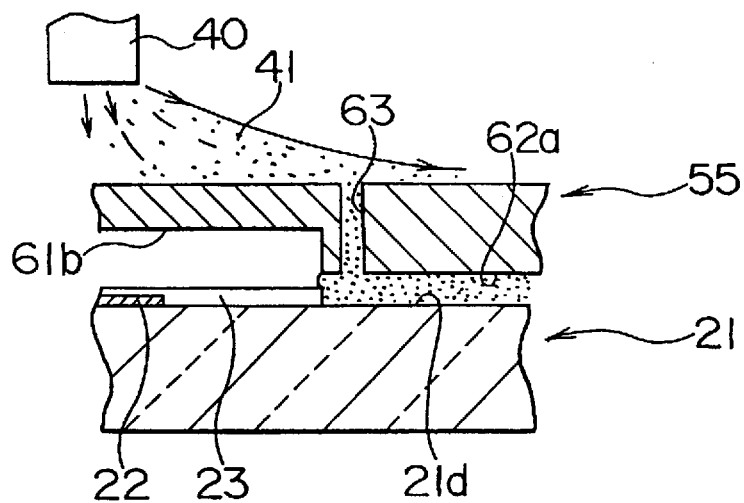
FIG. 11 is a similar view for use in describing another process carried out by the apparatus illustrated in FIG. 8.

Referring to FIG. 8 again and to FIGS. 10 and 11, the coated film 23 of the poly-siloxane SOG covers the shading films 22 and the principal surface 21a of the substrate 21 by the use of spin coating to form the substrate block illustrated in FIG. 10. The substrate block is set on the apparatus as shown in FIG. 8 with the principal surface 21a of the substrate 21 directed upwards in FIG. 8. Hence the substrate 21 is not inverted, which is different from FIGS. 2 through 7. Therefore, the apparatus of FIG. 8 is more effective in handling the substrate in comparison with that shown in FIGS. 2 through 7.

Next, the guide member 55 covers the substrate block and is fixed to the support member 51 by the positioning pins 65. In this event, the guide member 55 covers the peripheral region 21d of the principal surface 21a with the gap of 0.15 millimeter between the coated film 23 and the wall end surface 62a, as best shown in FIG. 10 and with the inside space of 1.65 millimeters between the inside surface 61a and the substrate block. As mentioned before, the nylon rings 66 serve to preserve the gap between the coated film 23 and the wall end surface 62a. It is assumed that the guide member 55 covers the peripheral region 21d of a width of 20 millimeters. In addition, a side gap is also left between the outer periphery of the substrate 21 and the wall part 51c of the support member 51.

In this condition, the solvent 41 is discharged from of the nozzle 40 to remove the coated film 23 on the peripheral region 21d of the substrate and to consequently manufacture the phase shift mask blank which has an uncovered area on the peripheral region 21d of the substrate 21. Specifically, acetone in an amount of about 25 millimeters is supplied as the solvent 41 through the nozzle 40 while the support member 51 is rotated together with the substrate block and the guide member 55 at a rotation speed of 200 rpm for about 15 seconds. During this process, the solvent 41 is caused to flow through the holes 63 downwards in FIG. 8 from the base surface 61a of the guide member 55 and into the gap between the substrate block and the wall end surface 62a. Thereafter, the solvent 41 quickly travels outwards of the substrate block due to the capillarity and the centrifugal force resulting from the rotation of the support member 51, as illustrated in FIG. 10. The solvent 41 also passes through the side gap between the support member 51 and the substrate block to be brought into contact with the side surface 21c and the back surface 21b of the substrate 21.

As a result, the coated film 23 is removed from the peripheral region 21d, the side surface 21c, and the back surface 21b of the substrate 21 by the solvent 41 in the manner described with reference to FIGS. 2 through 7.

On the other hand, the solvent 41 does not pass towards the center region of the principal surface 21a of the substrate 21 due to the surface tension of the solvent 41, as shown in FIG. 9. This is because the inside space between the substrate block and the inside surface 61b of the guide member 55 is very much greater than the gap between the substrate block and the wall end surface 62a.

Thus, the coated film 23 is dissolved by the solvent 41 at the peripheral region 21d of the substrate 21, namely, the processing region and is not dissolved at the center or the unprocessing region of the substrate 21, as best shown in FIG. 11.

After the above-mentioned reaction is finished for dissolving the coated film 21 by the solvent 41, the support member 51 is rotated again at the rotation speed of 200 rpm for about 20 seconds together with the substrate block and the guide member 55 with supply of the solvent stopped. During this rotation of the support member 51, the solvent is scattered outwards, as symbolized by arrows in FIG. 8, and the unnecessary coated film is removed from the substrate 21. Herein, such a scattering process of the solvent 41 should be made before the viscosity of the solvent 41 becomes undesirably high due to volatilization of the solvent 41.

Subsequently, the support member 51 is further rotated at the rotation speed of 400 rpm for 10 seconds together with the substrate 21 and the guide member 55 so as to thoroughly carry out the removal of the unnecessary coated film and to dry the substrate 21. Thereafter, the rotation of the support member 51 is stopped. Then, the substrate block from which the coated film 23 is removed at the peripheral region 21d of the substrate 21 is separated from the apparatus illustrated in FIG. 8 and is subsequently baked to convert the coated film 23 to a phase shift film. Thus, the substrate block becomes the phase shift mask blank.

Figure 12:
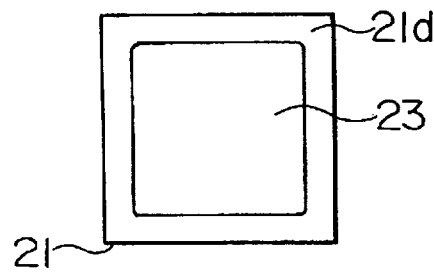
FIG. 12 is a plan view for use in describing a phase shift mask blank manufactured by the apparatus illustrated in FIG. 8.

Referring to FIG. 12, the phase shift mask blank manufactured in the above-mentioned apparatus and manner has the phase shift film 23 left in the center region of the substrate 21 and at the peripheral region 21d it is uncovered. The uncovered peripheral region 21d has a width of about 20 millimeters and forms a processed region. Thus, when the heaped up portion 23b has the maximum thickness of about 1.6 micronmeters and a thickness of 0.3 micronmeter at a position 20.5 millimeters from the outer periphery of the substrate blank before the above-mentioned process is carried out by the use of the above-mentioned apparatus, the maximum thickness portion is completely removed from the phase shift film 23 which has a thickness of about 0.3 micronmeter at the edge portion thereof. The peripheral region 21d is completely flat because the coated film 23 is thoroughly removed from the peripheral region 21d. With this structure, no cracking takes place in the phase shift film 23 because the phase shift film 23 is only 0.3 micronmeter thick.

Furthermore, the solvent 41 smoothly and reliably travels through the gap between the wall end surface 62a and the substrate block due to capillarity. However, the solvent 41 does not pass to the unprocessing or center region of the principal surface 21a because no influence takes place due to wind force resulting from the rotation. Therefore, the processing region, namely, the peripheral region 21d alone is accurately processed or removed by the solvent 41.

Figure 13:
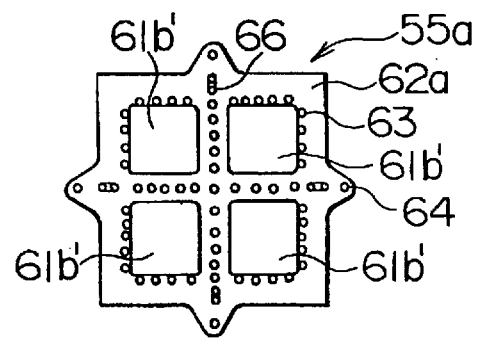
FIG. 13 is a plan view of another guide member used in the apparatus illustrated in FIG. 8.
Figure 14:
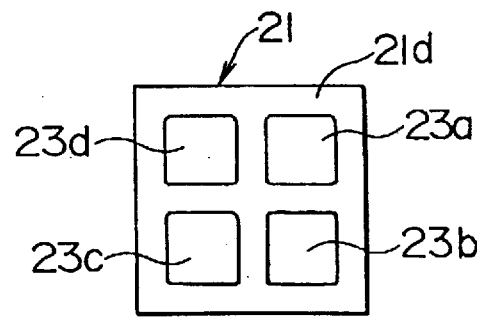
FIG. 14 is a plan view of a product manufactured by the use of the guide member shown in FIG. 13.

Referring to FIGS. 13 and 14, an apparatus according to a modification of the second embodiment of this invention comprises a guide member 55a illustrated in FIG. 13. As shown in FIG. 13, the guide member 55a has a wall end surface 62a which covers not only the peripheral region 21d of the substrate 21 but also the center region of the substrate 21 in a crisscross manner. In other words, the inside surface 61b of the guide member 55a is divided into four square surfaces 61b' each of which is surrounded by the wall end surface 62a, as illustrated in FIG. 14. In the wall end surface 62a, a number of holes 63 are arranged so that each of the square surface 61b' is surrounded by a line of the holes 63. In addition, the openings 64 are provided in the projected portions of the guide member 55a as in the guide member 55 shown in FIG. 9 to fix the guide member 55a to the support member 51 by the positioning pins 65 (FIG. 8). The nylon rings 66 are placed in the vicinity of the openings 64 as in FIG. 8.

The guide member 55a shown in FIG. 13 is set into the apparatus of FIG. 8 in a manner similar to the guide member 55 to process the substrate block with the gap left between the wall end surface 62a and the substrate block. The solvent 41 is discharged from the nozzle 40 onto the guide member 55a to be supplied through the holes 63 onto the substrate block. The solvent 41 passes through the gap over the wall end surface 62a of the guide member 55a and is maintained within the gap. On supply of the solvent 41, the support member 51 may be rotated in a manner similar to that illustrated in conjunction with FIGS. 8 through 11 or it may not be rotated.

At any rate, the phase shift mask blank shown in FIG. 14 is manufactured by the above-mentioned process. In FIG. 14, the phase shift mask blank has four partial phase shift films 23a to 23d left on the substrate 21 with the remaining parts uncovered or exposed.

Figure 15:
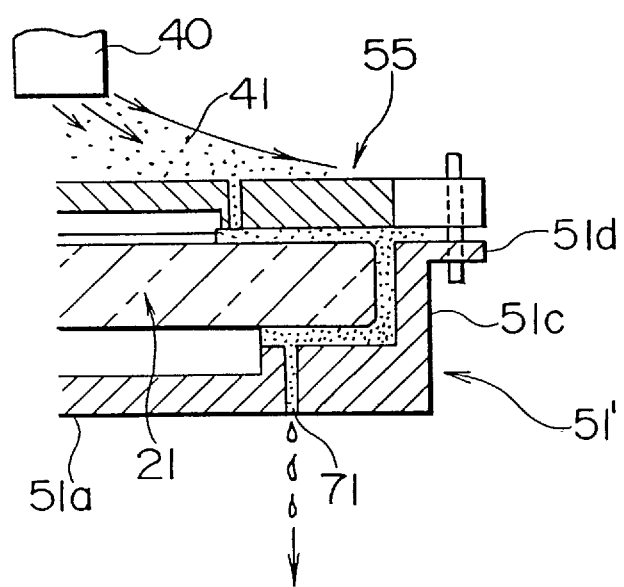
FIG. 15 is a partial sectional view of an apparatus according to a modification of the second embodiment illustrated in FIG. 8.

Referring to FIG. 15, another apparatus according to a modification of the second embodiment of this invention comprises a support member 51' somewhat modified from that illustrated in FIG. 8. Specifically, the support member 51' has a bottom part 51a, an extended part 51b, a wall part 51c, and an external part 51d as in FIG. 8. The extended part 51b is offset from the bottom part 51a and has an opening 71 formed through the extended part 51b. The opening 71 serves to discharge superfluous solvent 41 which is supplied to the back surface 21b of the substrate 21. In this case, a guide thread or needle (not shown) may be suspended from the opening 71 so as to smoothly guide the superfluous solvent 41 and discharge the same.

Although the above description has been made only with reference to the phase shift mask blank, this invention may be also applied either to removal of an unnecessary resist film on manufacturing a photomask, a photomask blank, a semiconductor substrate, and the like or to the removal of an insulating film deposited on an electrode portion formed on a display substrate.

To the contrary, this invention may be used for forming a coated film on a substrate. More particularly, assume the apparatus illustrated in FIGS. 2 or 8 is used for manufacturing a reticle testing substrate which comprises a quartz substrate, an opaque film of chromium deposited on a peripheral region of the quartz substrate, and a resist film coated on a center region of the quartz substrate and the opaque film. In this event, the opaque film is deposited on the entire surface of the substrate to be etched from the center region of the quartz substrate and is left only on the peripheral region of the quartz substrate. Before etching the opaque film from the center region, a photo resist film is formed or left only on the peripheral region of the quartz substrate. Such a photo resist film must be deposited on the entire opaque film and thereafter selectively exposed to leave the photo resist film only on the peripheral region.

However, such a photo resist film can be selectively formed on the peripheral region of the quartz substrate directly by the use of the apparatus according to this invention. To this end, the guide member 31 or 51 covers the center region of the quartz substrate after the opaque film is deposited over the entire principal surface. In this situation, the guide member is opposed to the opaque film formed on the peripheral region of the quartz substrate with the gap left between the guide member and the opaque film. The gap is extended on the peripheral region of the quartz substrate. A resist solution is discharged from the nozzle to flow to the gap and be kept within the gap. Consequently, a resist film is formed on the opaque film only on the peripheral region of the quartz substrate. Thus, the resist film can be formed only on a desirable region by the use of the apparatus according to this invention. In this connection, the resist solution and the solvent may be collectively called a processing solution.

Likewise, this invention may be used either for forming a protection film on manufacturing a magnetic disk or for forming a protection film on manufacturing a color filter.

Stated otherwise, this invention is effective to process a substrate by the use of a solution which may either remove a film or form a film. In addition, such a film processed by this invention may be formed by sputtering, chemical vapor deposition (CVD), ion plating, evaporation, or the like.

While this invention has thus far been described in conjunction with a few embodiments thereof, it will be readily understood for those skilled in the art to put this invention into practice in various other ways. For example, removal of the poly-siloxane SOG film may be made by the use of methanol, isopropyl alcohol while removal of the resist film may be made by the use of a ketone, ester, aromatic hydrocarbon, hydrocarbon halide, ether, or the like.

In the second embodiment illustrated in FIGS. 8 through 14, the holes 63 may be moved on the wall end surface 62a outwards in FIG. 8. However, it is preferable that the holes 63 be adjacent to an inner edge of the wall end surface 62a because the solvent 41 is caused to flow in an outward direction. Two lines of the holes 63 may be arranged on the wall end surface 62a instead of a single line of holes 63. With this structure, it is possible to protect the solvent 41 from being dried and left on an outer peripheral region of the substrate 21.

The gap between the wall end surface and the substrate block need not be restricted to 0.15 millimeter but may be selected in consideration of the viscosity of the solvent. In addition, the gap need not be uniform but may be changed within a range in which capillarity takes place. Various kinds of spacers may be used in lieu of the nylon rings.

Moreover, the guide member 55 illustrated in FIG. 8 may have a pyramidal shape in section, as shown in Japanese Patent Publication No. Shô 58-19350 or it may have a dome shape in section. Finally, the substrate to be processed may be circular, triangular, rectangular, polygonal, or the like.

What is claimed is:

1. A phase shift mask blank comprising:
    a substrate which has a principal surface divided into a central portion and a peripheral portion surrounding the central portion;
    an opaque film on the central portion; and
    a coated film on said substrate, said coated film being on the central portion and covering said opaque film, and being removed from the peripheral portion by a processing solution which is a solvent for said coated film, said processing solution being supplied through a gap, formed between said substrate and a guide member adjacent to said substrate, onto the peripheral portion which is exposed in said gap while the substrate is rotated, to produce capillarity and centrifugal force to be developed on said solution in the gap, said solvent being confined in said gap to said peripheral portion by said capillarity and said centrifugal force whereby only the coated film at said peripheral portion is dissolved by said solvent.

2. A phase shift mask blank as claimed in claim 1, wherein the substrate is rectangular and the coated film is also substantially rectangular and is operable as a phase shift film.

3. A phase shift mask blank as claimed in claim 2, wherein the rectangular phase shift film is divided into a plurality of rectangular partial phase shift films.

4. A phase shift mask blank as claimed in claim 1, wherein the coated film is a poly-siloxane SOG film.

5. A phase shift mask blank comprising:
- a substrate which has a principal surface divided into a central portion, and a peripheral portion surrounding the central portion;
- an opaque film on the central portion; and
- a coated film on said substrate, said coated film being on the central portion and covering said opaque film, and being removed from the peripheral portion by supplying a processing solution onto the peripheral portion by a method comprising:
  - positioning a guide member in adjacent facing relation to the principal surface of the substrate,
  - providing said guide member with a central portion and a raised peripheral portion offset from said central portion,
  - locating the guide member adjacent to the principal surface of the substrate such that the central portion of the guide member faces the central portion of the substrate while said peripheral portion of the guide member faces said peripheral portion of the substrate, said peripheral portion of the guide member forming a gap with the peripheral portion of the substrate while the central portion of the guide member forms a space with the central portion of the substrate, said peripheral portion of the guide member being closer to the substrate at said gap as compared to the distance of said central portion of the guide member from said substrate at said space, and
  - introducing a solvent for said coated film into said gap while rotating said guide member and said substrate together about a substantially central axis which keeps the solvent confined to said gap by surface tension of the solvent and achieves dissolution of said film at said peripheral portion of the substrate while said film at said central portion of the substrate is not contacted by said solvent.

* * * * *

UNITED STATES PATENT AND TRADEMARK OFFICE
CERTIFICATE OF CORRECTION

PATENT NO. : 5,869,211
DATED : February 9, 1999
INVENTOR(S) : Kunihiko KOSHIISHI It is certified that error appears in the above-identified patent and that said Letters Patent is hereby corrected as shown below:

Column 7,   line 37, after "member" insert -- 31 and the --.
Column 15,  line 5(claim 5, line 3), after "portion" delete the comma ",".

Signed and Sealed this

Twenty-first Day of September, 1999

Attest:

Q. TODD DICKINSON

*Attesting Officer*   *Acting Commissioner of Patents and Trademarks*